(12) United States Patent
Sawada

(10) Patent No.: US 10,896,275 B2
(45) Date of Patent: Jan. 19, 2021

(54) VERIFICATION APPARATUS AND METHOD FOR VERIFYING OPERATION OF INTEGRATED CIRCUIT

(71) Applicant: Toshiba Memory Corporation, Tokyo (JP)

(72) Inventor: Kazunao Sawada, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/558,374

(22) Filed: Sep. 3, 2019

(65) Prior Publication Data

US 2020/0257332 A1    Aug. 13, 2020

(30) Foreign Application Priority Data

Feb. 7, 2019 (JP) ................................. 2019-020388

(51) Int. Cl.
*G06F 1/12* (2006.01)
*G06F 30/3312* (2020.01)
*G06F 11/263* (2006.01)

(52) U.S. Cl.
CPC ............ *G06F 30/3312* (2020.01); *G06F 1/12* (2013.01); *G06F 11/263* (2013.01)

(58) Field of Classification Search
CPC ...... G06F 1/12; G06F 11/263; G06F 11/2635; G06F 30/3312
USPC .......................................................... 327/141
See application file for complete search history.

(56) References Cited

U.S. PATENT DOCUMENTS

| 8,407,636 | B2 | 3/2013 | Iwashita | |
|---|---|---|---|---|
| 8,661,384 | B2 | 2/2014 | Iwashita | |
| 9,952,650 | B2 | 4/2018 | Chen et al. | |
| 2005/0216247 | A1* | 9/2005 | Ikeda | G06F 30/35 703/19 |
| 2005/0268265 | A1* | 12/2005 | Ly | G06F 30/33 716/108 |
| 2007/0129923 | A1* | 6/2007 | Langer | G06F 30/33 703/13 |
| 2009/0063086 | A1* | 3/2009 | Kawasaki | G01R 31/318364 702/117 |
| 2013/0055182 | A1 | 2/2013 | Iwashita | |

FOREIGN PATENT DOCUMENTS

| JP | 5733109 B2 | 2/2013 |
|---|---|---|
| JP | 5900053 B2 | 2/2013 |

\* cited by examiner

*Primary Examiner* — William Hernandez
(74) *Attorney, Agent, or Firm* — Kim & Stewart LLP

(57) ABSTRACT

A method is for verifying a logic operation of a target circuit including a circuit module configured to dynamically switch between synchronous transfer and asynchronous transfer. The method includes setting a time window for detecting an erroneous change of a logical value of a data signal. The time window ranges a first time period forward and a second time period backward from an edge of a clock signal and excludes a certain sub range. The method includes, during a simulation, determining whether or not the erroneous change of the logical value of the data signal is detected during the set time window. The method includes, upon detection of the erroneous change, inserting an erroneous sample into a test vector for the simulation, and upon non detection of the erroneous change, continuing the simulation without inserting the erroneous sample.

20 Claims, 8 Drawing Sheets

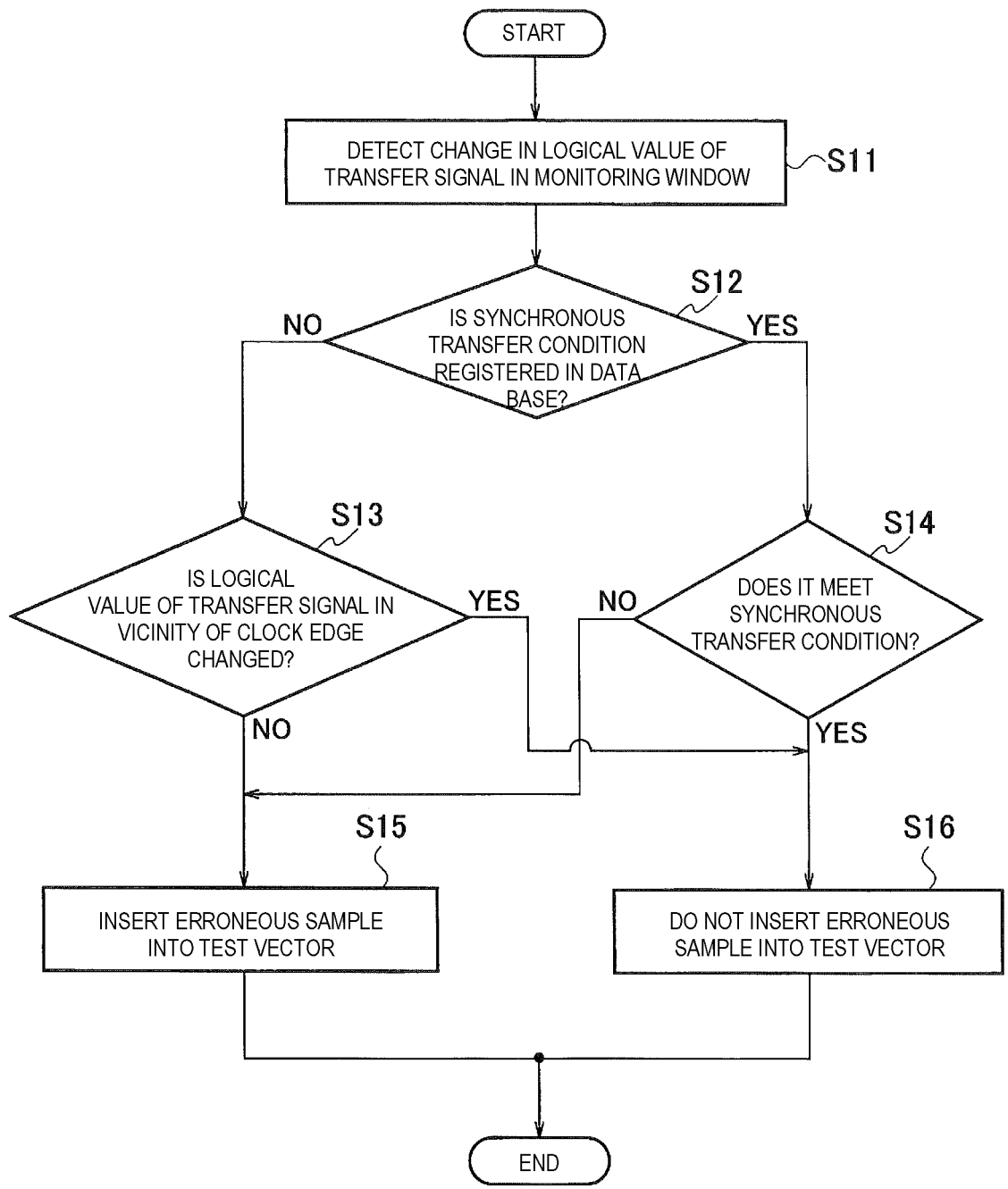

US 10,896,275 B2

VERIFICATION APPARATUS AND METHOD FOR VERIFYING OPERATION OF INTEGRATED CIRCUIT

CROSS-REFERENCE TO RELATED APPLICATION

This application is based upon and claims the benefit of priority from Japanese Patent Application No. 2019-020388, filed Feb. 7, 2019, the entire contents of which are incorporated herein by reference.

FIELD

Embodiments described herein relate generally to a verification apparatus and a method for verifying operation of an integrated circuit.

BACKGROUND

A plurality of clock signals with different periods may be used in one integrated circuit. A circuit block operated with the same clock signal is referred to as a "clock domain." Dynamic clock domain crossing verification, referred to as "dynamic CDC verification," is implemented to verify signal transfer operation between the clock domains in the integrated circuit in which the clock domains are dynamically switched.

In dynamic CDC verification, a phenomenon, referred to as a "metastable phenomenon," in which a reception side clock domain cannot correctly import data at transferring between asynchronous clock domains is intentionally simulated. Transferring data between the asynchronous clock domains is referred to as "asynchronous transferring." The transferring of data between synchronized clock domains is referred to as "synchronous transferring."

The dynamic CDC verification is carried out to verify whether or not the integrated circuit operates properly even if the metastable phenomenon occurs in asynchronous transfer. However, since switching of a synchronous transfer cannot be recognized when a transfer of a signal at a data transfer location is switched from asynchronous transfer to synchronous transfer, the metastable phenomenon may be generated for the synchronous transfer. As a result, an error, referred to as "pseudo error," occurs even if there is no actual problem with the integrated circuit.

DESCRIPTION OF THE DRAWINGS

FIG. 10 is a flow chart of a method of inserting an erroneous sample into a test vector by the verification apparatus according to the embodiment.

DETAILED DESCRIPTION

Figure 1:
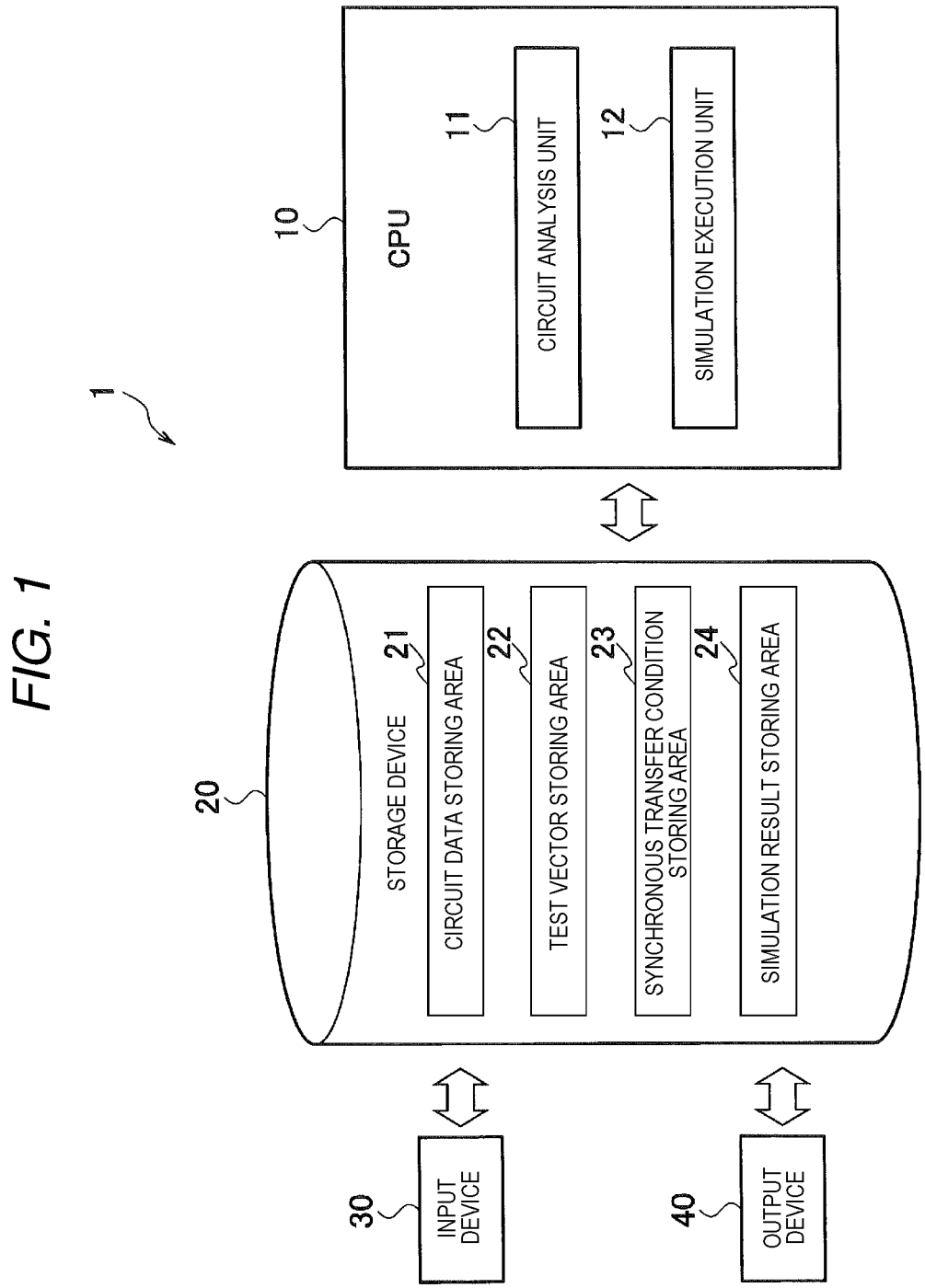
FIG. 1 is a block diagram illustrating a configuration example of a verification apparatus according to an embodiment.

Embodiments provide a verification apparatus and a simulation method capable of reducing occurrence of a pseudo error in an integrated circuit in which clock domains are dynamically switched during simulation to verify operation of the integrated circuit.

In general, according to an embodiment, a method is for verifying a logic operation of a target circuit including a circuit module configured to dynamically switch between synchronous transfer and asynchronous transfer of a data signal from a transmission side operable in accordance with a first clock signal to a reception side operable in accordance with a second clock signal that is synchronous or asynchronous with the first clock signal. The method includes setting a time window for detecting an erroneous change of a logical value of the data signal based on circuit data of the target circuit. The time window ranges a first time period forward from an edge of the first clock signal and a second time period backward from the edge and excludes a sub range ranging a third time period forward from the edge and a fourth time period backward from the edge. The third time period is shorter than the first time period, and the fourth time period is shorter than the second time period. The method further includes starting a simulation of operation of the target circuit using the circuit data, and during the simulation, determining whether or not the erroneous change of the logical value of the data signal is detected during the set time window. Upon determining that the erroneous change is detected during the set time window, the method includes inserting, into a test vector for the simulation, an erroneous sample that causes the reception side to fail in correctly receiving the data signal. Upon determining that the erroneous change is not detected during the set time window, the method includes continuing the simulation without inserting the erroneous sample into the test vector.

Hereinafter, an example embodiment will be described with reference to drawings. In the drawings, the same elements will be denoted by the same reference numerals and repeated description thereof may be omitted.

A verification apparatus 1 according to the embodiment verifies a logic operation of a circuit including a data transfer module at which switching between asynchronous transfer and synchronous transfer of a transfer signal from a transmission side clock domain operated in accordance with a transmission side clock signal to a reception side clock domain operated in accordance with a reception side clock signal is dynamically performed. As illustrated in FIG. 1, the verification apparatus 1 includes a central processing unit (CPU) 10 including a circuit analysis unit 11 and a simulation execution unit 12, and a storage device 20. The storage device 20 has a circuit data storing area 21, a test vector storing area 22, a synchronous transfer condition storing area 23 and a simulation result storing area 24. Circuit data and a test vector of the circuit to be verified input via an input device 30 are stored in the circuit data storing area 21 and the test vector storing area 22 respectively. In the synchronous transfer condition storing area 23, transfer conditions described below are stored. In the simulation result storing area 24, a result of the simulation executed by the simulation execution unit 12 is stored.

The circuit analysis unit 11 analyzes the circuit data of the circuit to be verified and detects a presence or absence of a configuration for switching the clock signal of the data transfer module. The simulation execution unit 12 executes simulation of the circuit to be verified using the test vector to verify a logic operation of the circuit to be verified. The verification result is output from an output device 40. For example, a verification result in which different portions between the output signal obtained by simulation and an expected value of the output signal are specified is obtained.

First, dynamic CDC verification performed by the verification apparatus 1 will be described.

When timing violation occurs at a data transfer module in which a signal is transferred from a transmission side clock domain to a reception side clock domain, the transferred signal (hereinafter, referred to as "transfer signal") becomes unstable. Here, the timing violation is a change in the logic value of the transfer signal at a setup time or hold time of the clock signal. By the timing violation, a metastable phenomenon in which the reception side clock domain cannot correctly import the transfer signal may be generated.

The verification apparatus 1 executes a simulation by inserting an erroneous sample for intentionally generating a metastable phenomenon in a test vector at a time where the metastable phenomenon might be expected to occur in an actual operation of the circuit being verified. In the erroneous sample, for example, the logical value in a normal operation of a signal propagating in the reception side clock domain is replaced with a logical value when the metastable phenomenon is generated. Then, it is verified that the integrated circuit operates properly even if the metastable phenomenon is generated in asynchronous transfer. In the following, a condition for inserting the erroneous sample into the test vector is referred to as a "metastable generation condition".

Figure 2:
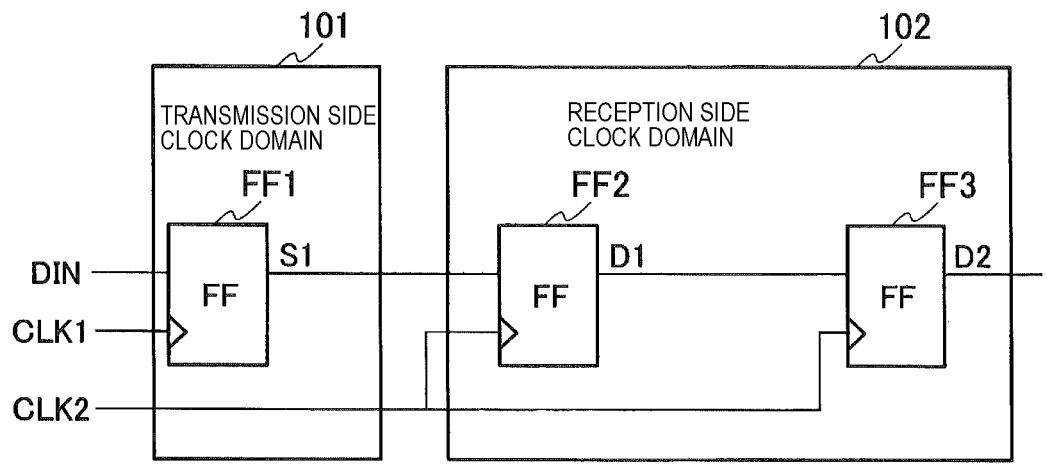
FIG. 2 is a circuit diagram illustrating an example of a module that carries out data transfer.

Hereinafter, an example of dynamic CDC verification by the verification apparatus 1 will be described with reference to the circuit illustrated in FIG. 2. FIG. 2 illustrates a data transfer module where transfer of a transfer signal S1 is performed between a transmission side clock domain 101 and a reception side clock domain 102. In the circuit illustrated in FIG. 2, a first flip-flop FF1 operated in accordance with transmission side clock signal CLK1 is the transmission side clock domain 101. A second flip-flop FF2 and a third flip-flop FF3 operated in accordance with a reception side clock signal CLK2 configure the reception side clock domain 102.

A transfer signal S1 output from the first flip-flop FF1 to which an input signal DIN is input is input to the second flip-flop FF2. A propagation signal D1 output from the second flip-flop FF2 is input to the third flip-flop FF3. An output signal D2 is output from the third flip-flop FF3.

Figure 3:
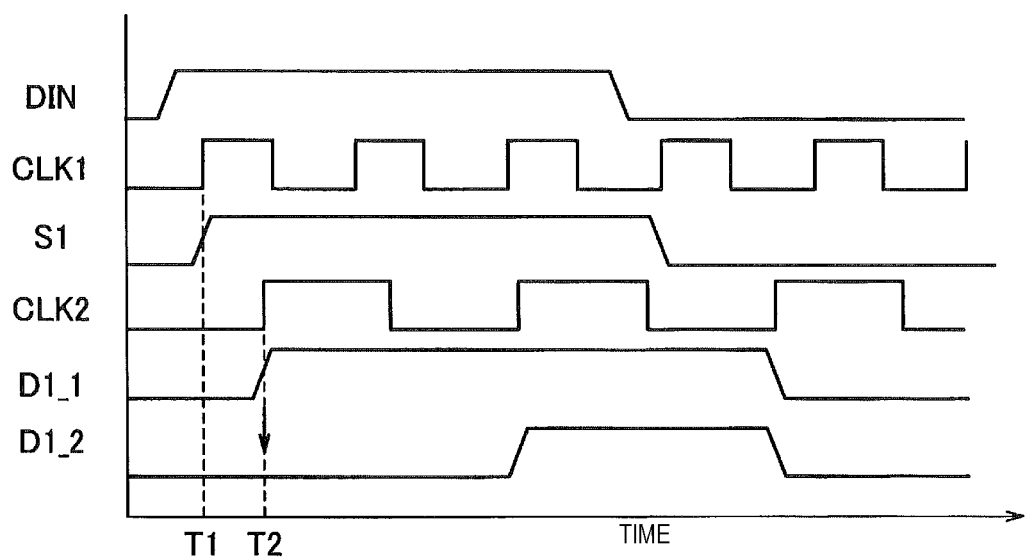
FIG. 3 is an example of a timing chart of a circuit diagram illustrated in FIG. 2.

FIG. 3 illustrates a timing chart in dynamic CDC verification of the circuit illustrated in FIG. 2. In FIG. 3, the propagation signal D1 in a normal operation is indicated by a signal pattern D1_1, and an erroneous sample for intentionally generating a metastable phenomenon is indicated by a signal pattern D1_2.

At a time T1 in FIG. 3, the logical value of the transfer signal S1 changes from "0" to "1". It is assumed that the change of the logic value of the transfer signal S1 is a timing violation. Therefore, in the signal pattern D1_2, the logical value does not change to "1" at a time T2, and remains "0", as indicated by an arrow and the difference from the signal pattern D1_1. That is, the erroneous sample shown as the signal pattern D1_2 is a metastable phenomenon in which the reception side clock domain 102 cannot properly import the transfer signal S1 at time T2.

As described above, in the dynamic CDC verification, in the normal operation, the erroneous sample is inserted into the test vector instead of signal patterns in the normal operation. Accordingly, the metastable phenomenon at the data transfer module is intentionally generated. In this manner, the verification apparatus 1 verifies that the circuit operates properly even if the metastable phenomenon is generated at the data transfer module in which the asynchronous transfer is performed.

Next, with reference to the circuit illustrated in FIG. 4, a case where the data transfer module is switched from asynchronous transfer to synchronous transfer will be described. The configurations of the transmission side clock domain 101 and the reception side clock domain 102 of the circuit illustrated in FIG. 4 are the same as those of the circuit illustrated in FIG. 2.

Figure 4:
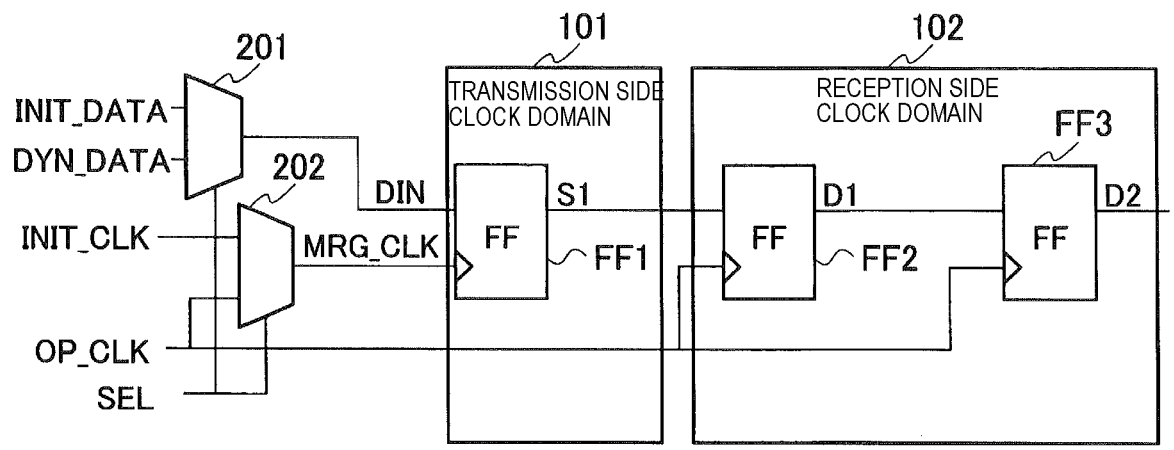
FIG. 4 is a circuit diagram illustrating another example of a module that carries out data transfer.

In the circuit illustrated in FIG. 4, one of a first input signal INIT_DATA and a second input signal DYN_DATA is selected by a data selector circuit 201, and is input to the transmission side clock domain 101 as the input signal DIN. In addition, one of a first clock signal INIT_CLK and a second clock signal OP_CLK is selected by a clock selector circuit 202, and the first flip-flop FF1 of the transmission side clock domain 101 is operated in accordance with a transmission side clock signal MRG_CLK. The second flip-flop FF2 and the third flip-flop FF3 of the reception side clock domain 102 are operated in accordance with the second clock signal OP_CLK. When the second clock signal OP_CLK is selected by the clock selector circuit 202, the transfer signal S1 is synchronously transferred between the transmission side clock domain 101 and the reception side clock domain 102.

The data selector circuit 201 and the clock selector circuit 202 are controlled by a select signal SEL. That is, by control of the select signal SEL, asynchronous transfer and synchronous transfer of the transfer signal S1 between the transmission side clock domain 101 and the reception side clock domain 102 are dynamically switched. In this manner, in the circuit illustrated in FIG. 4, there is a switching circuit of the transmission side clock signal for driving the first flip-flop FF1.

Figure 5:
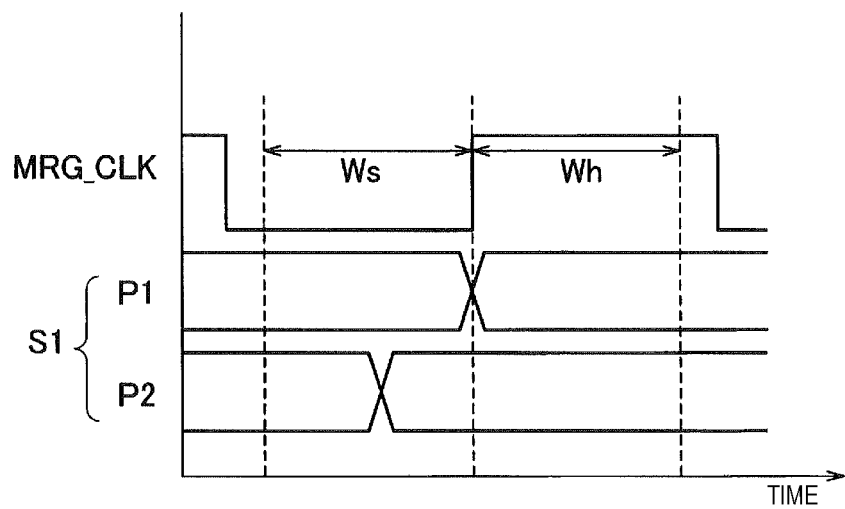
FIG. 5 is a timing chart for illustrating a timing error.

An example of a timing violation in asynchronous transfer and synchronous transfer of the circuit illustrated in FIG. 4 is illustrated in FIG. 5. In the synchronous transfer, as shown by a signal pattern P1 in FIG. 5, the logic value of the transfer signal S1 changes in a vicinity of a clock edge which is a boundary between a setup time Ws of the transmission side clock signal MRG_CLK and a hold time Wh. On the other hand, in asynchronous transfer, as shown by a signal pattern P2 in FIG. 5, the logical value of the transfer signal S1 changes at a time distant from the clock edge.

In one of the signal pattern P1 and the signal pattern P2 illustrated in FIG. 5, a timing violation in which the logic value of the transfer signal S1 changes during the setup time Ws and hold time Wh of the transmission side clock signal MRG_CLK occurs. Hereinafter, the setup time Ws and the hold time Wh are collectively referred to as "monitoring window". The verification apparatus 1 detects that the logic value of the transfer signal changes in the monitoring window as a timing violation.

In the related-art dynamic CDC verification, when the logic value of the transfer signal S1 changes in the monitoring window, an erroneous sample for generating the metastable phenomenon is inserted into the test vector. That is, in any case of the signal pattern P1 and the signal pattern P2 illustrated in FIG. 5, the erroneous sample is inserted into the test vector.

However, when the data transfer module is the synchronous transfer, if the erroneous sample is inserted into the test vector, a pseudo error occurs.

Figure 6:
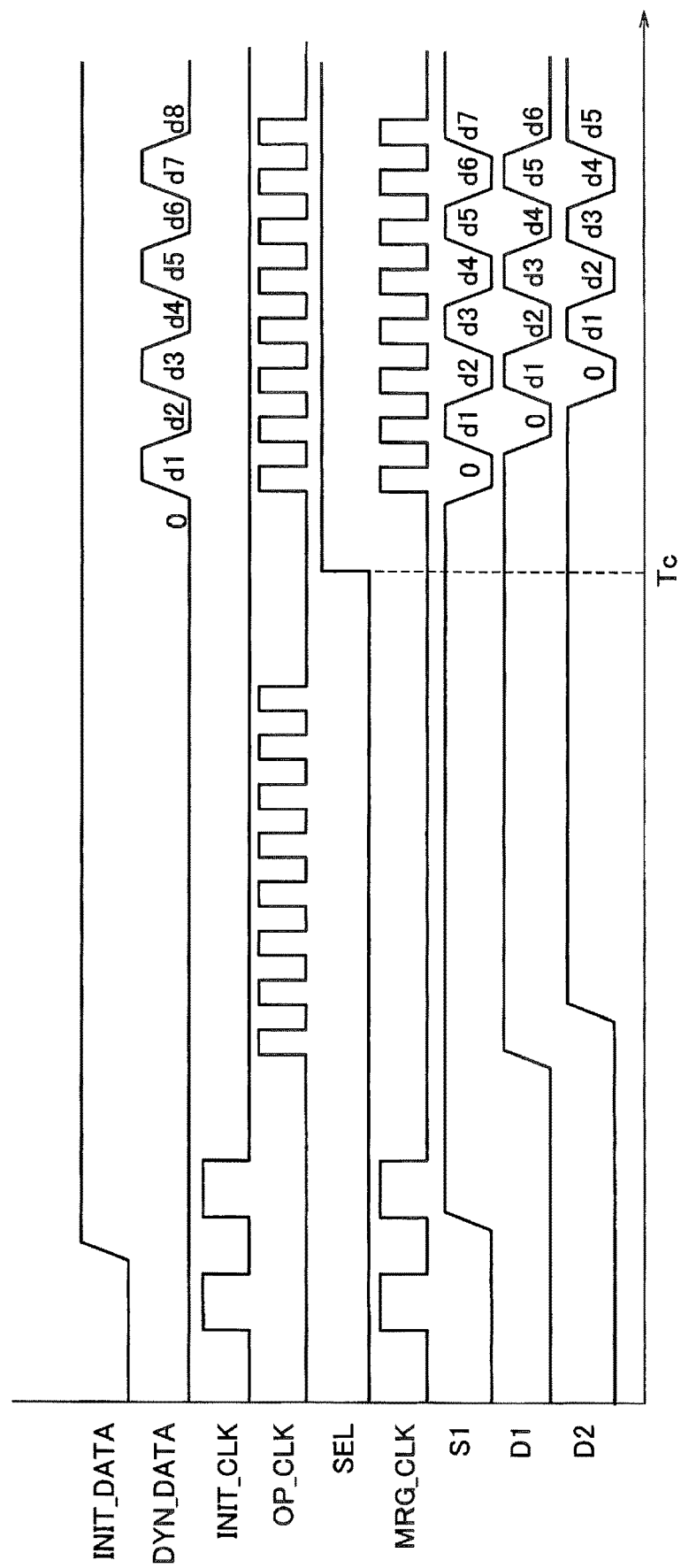
FIG. 6 is an example of a timing chart in a normal operation.
Figure 7:
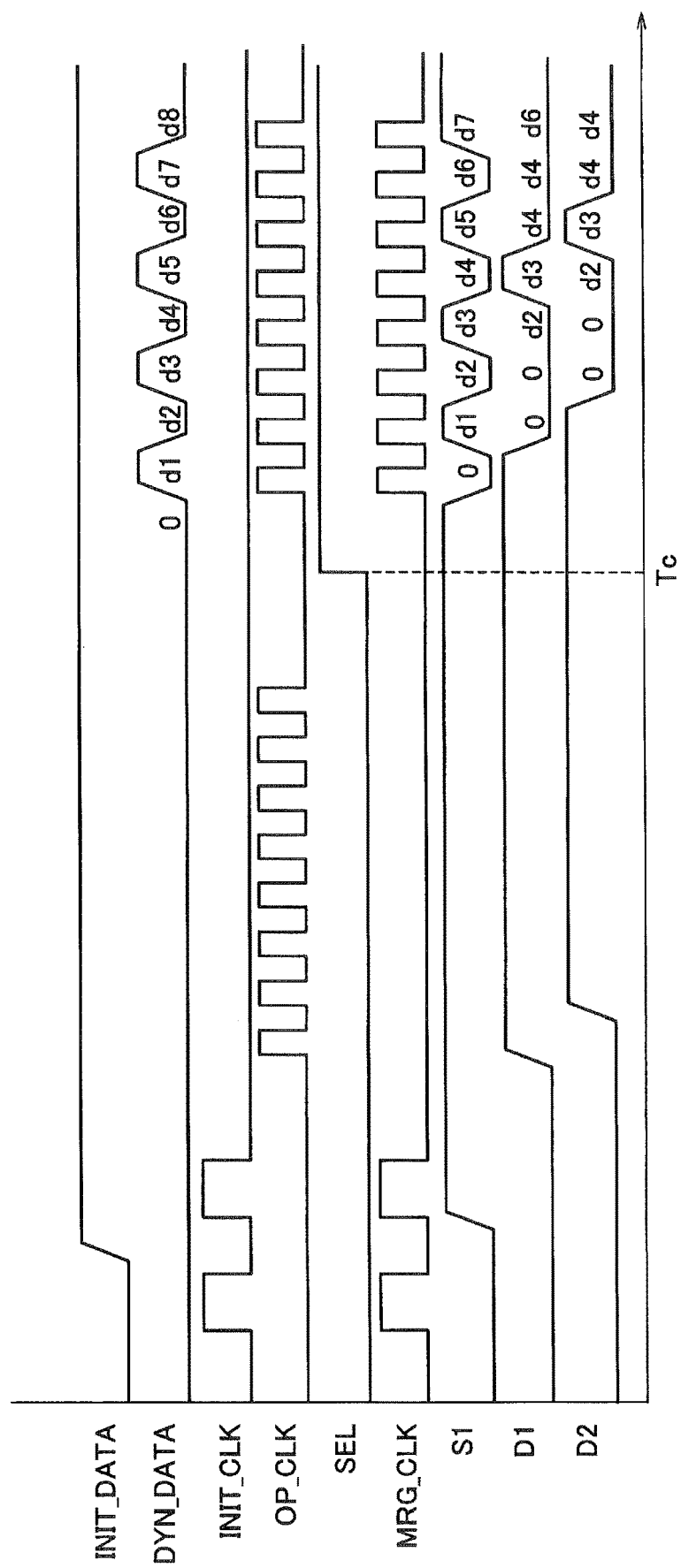
FIG. 7 is an example of a timing chart in which a pseudo error occurs.

An example where the pseudo error occurs in the circuit illustrated in FIG. 4 will be described by comparing the timing charts of FIG. 6 and FIG. 7. FIG. 6 illustrates a timing chart illustrating in a normal operation and FIG. 7 illustrates a timing chart illustrating the pseudo error. In FIGS. 6 and 7, data d1 to d8 are added to a part of the signal after switching from asynchronous transfer to synchronous transfer. The data d1 to d8 are assumed to be a case where 8-pit data is transferred. The data d1 to d8 of the second input signal DYN_DATA propagate to the transfer signal S1, the propagation signal D1, and the output signal D2.

In the timing charts illustrated in FIGS. 6 and 7, the control of the select signal SEL at a time Tc switches the data transfer module from asynchronous transfer to synchronous transfer. After the time Tc, the data d1 to d8 are transferred from the transmission side clock domain 101 to the reception side clock domain 102.

At this time, in the normal operation, as illustrated in FIG. 6, the data d1 to d7 are correctly read by the reception side clock domain 102. However, in the timing chart illustrated in FIG. 7, the timing violation is detected, and "0" is inserted in the data d1 as the erroneous sample instead of "1" which is an original logical value. In addition, "0" is inserted in the data d5 as the erroneous sample instead of "1" which is the original logical value. As a result, the pseudo error occurs in the output signal D2.

As described above, by inserting the erroneous sample into the test vector when the synchronous transfer is performed, the pseudo error occurs in dynamic CDC verification. Therefore, in the case of the synchronous transfer, it is necessary not to insert the erroneous sample into the test vector. However, since the number of data transfer modules in the circuit to be verified is generally large, it is difficult to distinguish between the synchronous transfer and the asynchronous transfer based on the state of the select signal SEL.

Therefore, the verification apparatus 1 analyzes the circuit data of the circuit to be verified by detecting the configuration for switching the clock signal at the data transfer module in order to reduce the occurrence of the pseudo error. Therefore, by switching the clock signal, it can be detected that the transfer of the signal at the data transfer module is switched from the asynchronous transfer to the synchronous transfer. For example, the verification apparatus 1 detects a configuration in which the transmission side clock signal driving the transmission side clock domain is switched to the clock signal synchronized with the reception clock signal from the circuit data of the circuit to be verified.

For example, in the circuit illustrated in FIG. 4, the circuit analysis unit 11 analyzes a connection relation between the transmission side clock signal MRG_CLK for driving the transmission side clock domain 101 and the second clock signal OP_CLK for driving the reception side clock domain 102. When the configuration of switching the clock signal at the data transfer module is detected, the circuit analysis unit 11 detects a condition in which the transmission side clock signal MRG_CLK and the second clock signal OP_CLK are the same, that is, a condition in which the transfer of the transfer signal S1 is synchronous transfer (hereinafter, referred to as the "synchronous transfer condition").

For example, if the circuit data of the circuit to be verified includes a description such as "assign MRG_CLK=SEL?OP_CLK:INIT_CLK", the transmission side clock signal MRG_CLK and the second clock signal OP_CLK are in a connection relationship, and the synchronous transfer condition is determined to be established. In this manner, the verification apparatus 1 determines whether the transfer signal is asynchronously transferred at the data transfer module or it is synchronously transferred. The circuit analysis unit 11 stores the detected synchronous transfer conditions in the synchronous transfer condition storing area 23 and creates a database of the synchronous transfer.

The verification apparatus 1 executes the dynamic CDC verification of the circuit to be verified with reference to the synchronous transfer condition stored in the synchronous transfer condition storing area 23. That is, when the simulation execution unit 12 determines that the metastable generation condition is met, if determines that the synchronization transfer condition is not met, the simulation execution unit 12 inserts the erroneous sample to the test vector. In this manner, in a state where data is asynchronously transferred at the data transfer station, a meta-stable is intentionally generated to perform dynamic CDC verification. On the other hand, when it is determined that the synchronous transfer condition is met even when the metastable generation condition is reached, the simulation execution unit 12 does not insert the erroneous sample into the test vector. Therefore, the metastable phenomenon does not occur in a state where data is synchronously transferred at the data transfer module, and generation of the pseudo error can be reduced.

When the configuration for switching the clock signal at the data transfer position is detected, the synchronous transfer condition may not be detected. Therefore, when the configuration for switching the clock signal at the data transfer module is detected in the circuit to be verified, the simulation may be performed without inserting the erroneous sample into the test vector.

In addition, when the circuit configuration of the circuit to be verified is complicated, it may be difficult to configure of switching the clock signal at the data transfer module or to detect the synchronous transfer condition. Even in such a case, the data transfer module may be in the state of synchronous transfer. Therefore, when the configuration for switching the clock signal of the data transfer module cannot be detected, the verification apparatus 1 executes the dynamic CDC verification as follows.

That is, the verification apparatus 1 excludes the vicinity of the clock edge of the reception side clock signal from the target of the monitoring window. That is, the verification apparatus 1 does not insert the erroneous sample to the test vector for changes in the logic value of the transfer signal in the vicinity of the clock edge of the reception side clock signal.

Figure 8:
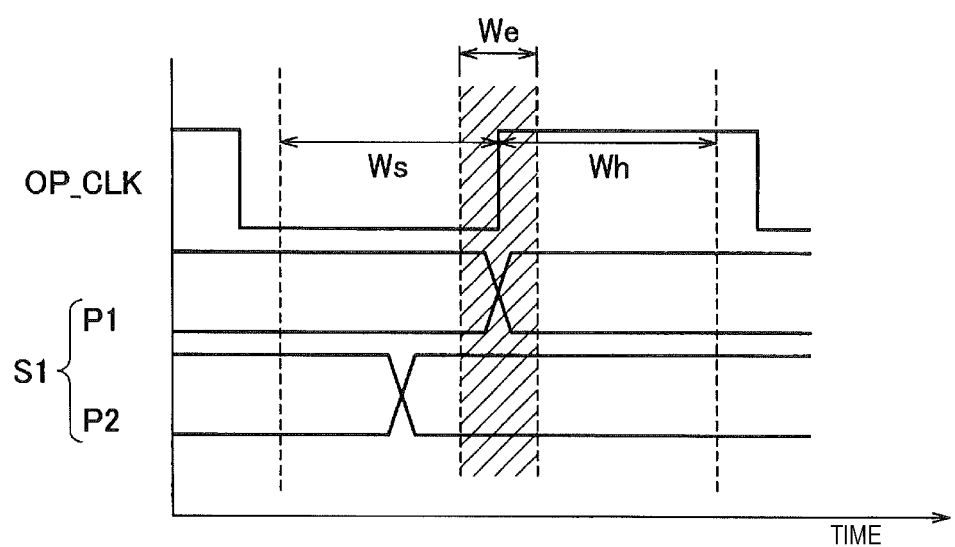
FIG. 8 is a timing chart for illustrating an exclusion period according to the embodiment.

In the synchronous transfer, as shown by the signal pattern P1 in FIG. 8, the logic value of transfer signal S1 transferred from the transmission side clock domain to the reception side clock domain changes in the vicinity of the clock edge of the reception side clock signal. Therefore, a constant period in the vicinity of the clock edge of the second clock signal OP_CLK hatched in FIG. 8 is specified as an exclusion period We. The verification apparatus 1 does not insert the erroneous sample into the test vector even if the logic value of the transfer signal S1 changes in the exclusion period We. In this manner, if the change in the logic value of the transfer signal is in the vicinity of the clock edge of the reception side clock signal, when the erroneous sample is not inserted into the test vector, the occurrence of pseudo errors is reduced.

On the other hand, in the asynchronous transfer, the logic value of the transfer signal changes other than the vicinity of the clock edge of the reception side clock signal. That is, as shown by the signal pattern P2 in FIG. 8, the logic value of the transfer signal S1 changes except the vicinity of the clock edge of the second clock signal OP_CLK which is set as the exclusion period We. Therefore, even if the verification apparatus 1 inserts the erroneous sample into the test vector, the pseudo error does not occur.

As described above, by excluding the vicinity of the clock edge of the reception side clock signal from the target of the monitoring window, the metastable phenomenon is generated in the asynchronous transfer, and the occurrence of the pseudo error in synchronous transfer is reduced.

It is preferable to set an appropriate clock skew between the transmission side clock signal and the reception side clock signal such that the logic value of the asynchronously transferred transfer signal does not change during the exclusion period We. In this manner, it possible to prevent the transfer signal in asynchronous transfer from being treated as a transfer signal in the synchronous transfer.

On the other hand, if the clock skew is too long, the transfer signal in the asynchronous transfer may be mistaken as the transfer signal in the synchronous transfer. On the other hand, if the clock skew is too short, the transfer signal in the synchronous transfer may be mistaken as the transfer signal in the asynchronous transfer.

As described above, by setting an appropriate clock skew between the transmission side clock signal and the reception side clock signal, it is possible to prevent the logic value of the transfer signal transferred asynchronously from changing in the exclusion period We excluded from the target of the monitoring window. Accordingly, the asynchronously transferred signal is prevented from being misidentified as the synchronously transferred signal, and the erroneous sample is inserted into the test vector.

The exclusion period We for exclusion from the target of the monitoring window is specified according to the period of the clock signal or the like. By specifying the exclusion period We to be long, even if the transfer signal is input to the reception side clock domain with a slight delay in the synchronous transfer, the erroneous sample is not inserted into the test vector. Therefore, the occurrence of the pseudo error is reduced. On the other hand, if the exclusion period We is too long, the logic value of the asynchronously transferred signal may change to the exclusion period We. The exclusion period We is specified to be, for example, about 1/100 to 1/50 of the cycle of the reception side clock signal.

Eight hundred (800) items of logic operation were verified by specifying the exclusion period We to be 1/50 of a cycle of the reception side clock signal. It was possible to reduce the occurrence of the pseudo error from 150 items in the related art to about 10 items.

A case where the vicinity of the clock edge at a rising edge of the reception side clock signal is excluded from the target of the monitoring window is described above. However, the vicinity of the clock edge at a falling edge of the reception side clock signal may be excluded from the target of the monitoring window. Accordingly, even in the state of the synchronous transfer, even when the logic value of the transfer signal changes in the vicinity of the falling clock edge of the reception side clock signal, insertion of the erroneous sample into the test vector is reduced. As a result, the occurrence of pseudo errors can be further reduced.

Figure 9:
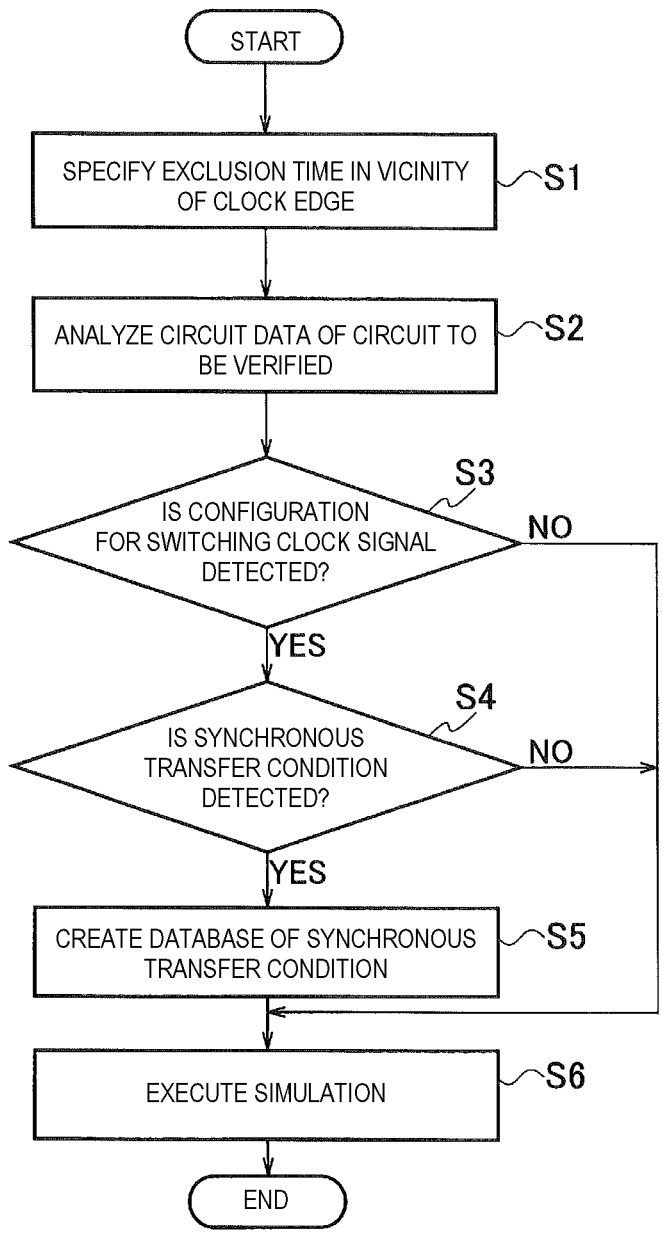
FIG. 9 is a flow chart of a verification method by the verification apparatus according to the embodiment.

FIG. 9 illustrates an example of a verification method by the verification apparatus 1 according to the embodiment.

In step S1, an exclusion period is specified in the vicinity of the clock edge of the reception side clock signal.

In step S2, the circuit analysis unit 11 analyzes the circuit data of the circuit to be verified. In step S3, a presence or absence of a configuration for switching the clock signal of the data transfer module is detected for the circuit to be verified. If the configuration for switching the clock signal is detected, the process proceeds to step S4. When the configuration for switching the clock signal is not detected, the process proceeds to step S6, and the simulation execution unit 12 executes a simulation of the circuit to be verified.

In step S4, the circuit analysis unit 11 detects the synchronous transfer conditions. If the synchronous transfer condition is detected, the process proceeds to step S5. If the synchronous transfer condition is not detected, the process proceeds to step S6 and a simulation is performed.

In step S5, the circuit analysis unit 11 stores the detected synchronous transfer condition in the synchronous transfer condition storing area 23, and creates a database of the synchronous transfer conditions. Thereafter, the process proceeds to step S6 and a simulation is performed.

As described above, the simulation execution unit 12 executes the simulation of the circuit to be verified in a state in which the exclusion period is defined in the vicinity of the clock edge of the reception side clock signal and the synchronous transfer conditions are databased. When the logic value of the transfer signal changes in the remaining period excluding the exclusion period of the monitoring window, the simulation execution unit 12 inserts the erroneous sample for generating the metastable phenomenon into the test vector to execute a simulation. If the logic value of the transfer signal changes during the exclusion period, the simulation execution unit 12 executes the simulation without inserting the erroneous sample into the test vector.

FIG. 10 shows a flowchart of a method for inserting the erroneous sample into a test vector by the verification apparatus 1. Hereinafter, a flow chart of FIG. 10 will be described.

When the simulation execution unit 12 detects a change in the logical value of the transfer signal in the monitoring window in step S11 during the simulation, the process proceeds to step S12. Here, it is assumed that the monitoring window includes the exclusion period We.

In step S12, the simulation execution unit 12 determines whether or not the synchronous transfer is registered in the database. If there is no synchronous transfer condition converted into a database, the process proceeds to step S13. On the other hand, if there are the synchronous transfer conditions converted into a database, the process proceeds to step S14.

In step S13, the simulation execution unit 12 determines whether or not there is a change in the logical value of the transfer signal in the vicinity of the clock edge of the reception side clock signal. That is, it is determined whether or not it is a change in the logical value of the transfer signal in the exclusion period. If the logic value of the transfer signal changes in the remaining period excluding the exclusion period, the process proceeds to step S15, and the simulation execution unit 12 inserts the erroneous sample into the test vector. On the other hand, when the logical value of the transfer signal changes in the exclusion period, the process proceeds to step S16 and the process is ended without inserting the erroneous sample into the test vector.

If the synchronous transfer condition is not registered in the database in step S12, it is determined whether or not the synchronous transfer condition is met in step S14. If the synchronous transfer condition is not met, the process proceeds to step S15, and the erroneous sample is inserted into the test vector. On the other hand, when the synchronous transfer condition is met, the process proceeds to step S16, and the process is ended without inserting the erroneous sample into the test vector.

As described above, in the verification apparatus 1 according to the embodiment, the method of determining whether to insert the erroneous sample into the test vector is changed according to the detection of the configuration for switching the clock signal of the data transfer module. That is, in the case where the configuration for switching the clock signal is not detected and the logic value of the transfer signal changes in the exclusion period of the monitoring window, the erroneous sample is not inserted into the test vector. On the other hand, in the case where it is detected that the clock signal is switched, the erroneous sample is not inserted into the test vector when the synchronous transfer conditions are established. In this manner, by using different methods to inhibit insertion of the erroneous sample into the test vector, even if the configuration for switching the clock signal or the synchronous transfer condition cannot be detected, insertion of the unintended erroneous sample into test vectors is prevented in the synchronous transfer. As a result, the occurrence of the pseudo error can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for verifying a logic operation of a target circuit including a circuit module configured to dynamically switch between synchronous transfer and asynchronous transfer of a data signal from a transmission side operable in accordance with a first clock signal to a reception side operable in accordance with a second clock signal that is synchronous or asynchronous with the first clock signal, the method comprising:
    setting a time window for detecting an erroneous change of a logical value of the data signal based on circuit data of the target circuit, wherein the time window ranges a first time period forward from an edge of the first clock signal and a second time period backward from the edge and excludes a sub range ranging a third time period forward from the edge and a fourth time period backward from the edge, the third time period shorter than the first time period, and the fourth time period shorter than the second time period;
    starting a simulation of operation of the target circuit using the circuit data;
    during the simulation, determining whether or not the erroneous change of the logical value of the data signal is detected during the set time window;
    upon determining that the erroneous change is detected during the set time window, inserting, into a test vector for the simulation, an erroneous sample that causes the reception side to fail in correctly receiving the data signal; and
    upon determining that the erroneous change is not detected during the set time window, continuing the simulation without inserting the erroneous sample into the test vector.

2. The method according to claim 1, further comprising:
    during the simulation, determining whether or not the erroneous change of the logical value of the data signal is detected during the sub range; and
    upon determining that the erroneous change is detected during the sub range, continuing the simulation without inserting the erroneous sample into the test vector.

3. The method according to claim 1, further comprising:
    during the simulation, determining whether or not a synchronous transfer condition that the circuit module performs the synchronous transfer from the transmission side to the reception side is satisfied; and
    upon determining that the synchronous transfer condition is satisfied, continuing the simulation without inserting the erroneous sample into the test vector.

4. The method according to claim 3, further comprising:
    obtaining the synchronous transfer condition from the circuit data.

5. The method according to claim 4, further comprising:
    performing an operation to detect the circuit module in the target circuit based on the circuit data; and
    upon the circuit module being detected, performing an operation to detect the synchronous transfer condition from the circuit data.

6. The method according to claim 5, further comprising:
    upon the synchronous transfer condition being detected, storing the synchronous transfer condition in association with the circuit module in a database; and
    during the simulation, whether or not the synchronous transfer condition is satisfied is determined based on the synchronous transfer condition stored in the database.

7. The method according to claim 1, wherein lengths of the third and fourth time periods are set such that the erroneous change of the logical value of the data signal does not occur during the third and fourth time periods when the circuit module performs the synchronous transfer from the transmission side to the reception side.

8. The method according to claim 1, further comprising:
    setting a clock skew of the first clock signal and the second clock signal, such that the erroneous change of the logical value of the data signal does not occur during the third and fourth time periods when the circuit module performs the synchronous transfer from the transmission side to the reception side.

9. The method according to claim 1, wherein the edge of the first clock signal is a rising edge.

10. The method according to claim 1, wherein the second time period is a set up time period of the first clock signal, and the first time period is a hold time period of the first clock signal.

11. A verification apparatus for verifying a logic operation of a target circuit including a circuit module configured to dynamically switch between synchronous transfer and asynchronous transfer of a data signal from a transmission side operable in accordance with a first clock signal to a reception side operable in accordance with a second clock signal that is synchronous or asynchronous with the first clock signal, the apparatus comprising a processor configured to:
    set a time window for detecting an erroneous change of a logical value of the data signal based on circuit data of the target circuit, wherein the time window ranges a first time period forward from an edge of the first clock signal and a second time period backward from the edge and excludes a sub range ranging a third time period forward from the edge and a fourth time period backward from the edge, the third time period shorter than the first time period, and the fourth time period shorter than the second time period;

start a simulation of operation of the target circuit using the circuit data;

during the simulation, determine whether or not the erroneous change of the logical value of the data signal is detected during the set time window;

upon determining that the erroneous change is detected during the set time window, insert, into a test vector for the simulation, an erroneous sample that causes the reception side to fail in correctly receiving the data signal; and upon determining that the erroneous change is not detected during the set time window, continue the simulation without inserting the erroneous sample into the test vector.

12. The verification apparatus according to claim 11, wherein the processor is further configured to:

during the simulation, determine whether or not the erroneous change of the logical value of the data signal is detected during the sub range; and upon determining that the erroneous change is detected during the sub range, continue the simulation without inserting the erroneous sample into the test vector.

13. The verification apparatus according to claim 11, wherein the processor is further configured to:

during the simulation, determine whether or not a synchronous transfer condition that the circuit module performs the synchronous transfer from the transmission side to the reception side is satisfied; and upon determining that the synchronous transfer condition is satisfied, continue the simulation without inserting the erroneous sample into the test vector.

14. The verification apparatus according to claim 13, wherein the processor is further configured to obtain the synchronous transfer condition from the circuit data.

15. The verification apparatus according to claim 14, wherein the processor is further configured to:

perform an operation to detect the circuit module in the target circuit based on the circuit data; and upon the circuit module being detected, perform an operation to detect the synchronous transfer condition from the circuit data.

16. The verification apparatus according to claim 15, wherein the processor is further configured to:

upon the synchronous transfer condition being detected, store the synchronous transfer condition in association with the circuit module in a storage device; and during the simulation, determine whether or not the synchronous transfer condition is satisfied based on the synchronous transfer condition stored in the storage device.

17. The verification apparatus according to claim 11, wherein the processor is further configured to set lengths of the third and fourth time periods such that the erroneous change of the logical value of the data signal does not occur during the third and fourth time periods when the circuit module performs the synchronous transfer from the transmission side to the reception side.

18. The verification apparatus according to claim 11, wherein the processor is further configured to set a clock skew of the first clock signal and the second clock signal, such that the erroneous change of the logical value of the data signal does not occur during the third and fourth time periods when the circuit module performs the synchronous transfer from the transmission side to the reception side.

19. The verification apparatus according to claim 11, wherein the edge of the first clock signal is a rising edge.

20. The verification apparatus according to claim 11, wherein the second time period is a set up time period of the first clock signal, and the first time period is a hold time period of the first clock signal.

* * * * *